(12) United States Patent
Ma

(10) Patent No.: US 12,207,534 B2
(45) Date of Patent: Jan. 21, 2025

(54) FLEXIBLE DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Kunsong Ma, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 512 days.

(21) Appl. No.: 17/622,897

(22) PCT Filed: Dec. 16, 2021

(86) PCT No.: PCT/CN2021/138623
§ 371 (c)(1),
(2) Date: Dec. 27, 2021

(87) PCT Pub. No.: WO2023/097792
PCT Pub. Date: Jun. 8, 2023

(65) Prior Publication Data
US 2023/0180590 A1   Jun. 8, 2023

(30) Foreign Application Priority Data

Dec. 3, 2021 (CN) .......................... 202111465289.0

(51) Int. Cl.
H10K 71/00 (2023.01)
H10K 77/10 (2023.01)
H10K 59/12 (2023.01)

(52) U.S. Cl.
CPC .......... *H10K 71/00* (2023.02); *H10K 77/111* (2023.02); *H10K 59/12* (2023.02); *H10K 59/1201* (2023.02)

(58) Field of Classification Search
CPC ...... H10K 71/00; H10K 77/111; H10K 59/12; H10K 59/1201; H10K 77/10;
(Continued)

(56) References Cited

U.S. PATENT DOCUMENTS 9,773,853 B2 *  9/2017  Tao ........................ H01L 25/167
10,185,190 B2 *  1/2019  Yamazaki ......... G02F 1/133345
(Continued)

FOREIGN PATENT DOCUMENTS

CN    107316952 A    11/2017
CN    108242424 A    7/2018
(Continued)

OTHER PUBLICATIONS

International Search Report in International application No. PCT/CN2021/138623, mailed on Aug. 29, 2022.
(Continued)

*Primary Examiner* — Eduardo A Rodela
(74) *Attorney, Agent, or Firm* — Rivka Friedman

(57) ABSTRACT

A flexible display panel and a manufacturing method thereof are disclosed. The method includes: forming a photodeformable layer on a carrier board; forming a flexible substrate on a side of the photodeformable layer away from the carrier board; forming a light-emitting device layer on a side of the flexible substrate away from the photodeformable layer; and irradiating the photodeformable layer with light having a predetermined wavelength until the photodeformable layer is deformed and is separated from the carrier board, thereby obtaining the flexible display panel.

18 Claims, 4 Drawing Sheets

(58) Field of Classification Search
CPC .......... H10K 2102/311; H01L 21/0272; H01L 21/0273; H01L 21/0275
See application file for complete search history.

(56) References Cited

U.S. PATENT DOCUMENTS

| | | | | |
|---|---|---|---|---|
| 10,325,941 | B2* | 6/2019 | Cai | H10K 71/80 |
| 10,720,476 | B2* | 7/2020 | Bae | H10K 77/111 |
| 11,469,375 | B2* | 10/2022 | You | H10K 59/131 |
| 11,476,420 | B2* | 10/2022 | Qian | H10K 59/40 |
| 11,513,624 | B2* | 11/2022 | Lee | G06F 3/04164 |
| 11,545,508 | B2* | 1/2023 | Yuan | H10K 77/111 |
| 11,812,644 | B2* | 11/2023 | Seo | H01L 27/1266 |
| 11,877,503 | B2* | 1/2024 | Paek | H10K 50/86 |
| 2007/0004171 | A1* | 1/2007 | Arana | H01L 21/6835 438/455 |
| 2014/0042399 | A1 | 2/2014 | Park et al. | |
| 2014/0141545 | A1 | 5/2014 | Lee et al. | |
| 2016/0300853 | A1* | 10/2016 | Yamazaki | G09G 3/035 |
| 2018/0247994 | A1* | 8/2018 | Seo | H01L 27/1218 |
| 2019/0198584 | A1* | 6/2019 | Chen | H10K 50/844 |
| 2019/0259822 | A1* | 8/2019 | Jeon | H01L 27/1218 |
| 2021/0043876 | A1* | 2/2021 | Kishimoto | C23C 18/06 |

FOREIGN PATENT DOCUMENTS

| | | |
|---|---|---|
| CN | 108695446 A | 10/2018 |
| CN | 109841734 A | 6/2019 |
| CN | 110556330 A | 12/2019 |
| CN | 110707131 A | 1/2020 |
| CN | 210110772 U | 2/2020 |
| CN | 111430301 A | 7/2020 |
| CN | 112071796 A | 12/2020 |

OTHER PUBLICATIONS

Written Opinion of the International Search Authority in International application No. PCT/CN2021/138623, mailed on Aug. 29, 2022.

Chinese Office Action issued in corresponding Chinese Patent Application No. 202111465289.0 dated Dec. 26, 2022, pp. 1-7.

* cited by examiner

FLEXIBLE DISPLAY PANEL AND MANUFACTURING METHOD THEREOF

FIELD

The present disclosure relates to a field of display technologies, and more particularly, to a flexible display panel and a manufacturing method thereof.

BACKGROUND

Flexible organic light-emitting diode (OLED) display devices have been widely researched and used because they have advantages such as a thin and light body and bendability. Flexible substrates are commonly used as a substrate of OLED display devices, and performance of the flexible substrates is vital to stability of electronic devices disposed on the flexible substrates. Currently, flexible substrates are formed according to following steps: forming an a-Si sacrificial layer on a glass substrate, sequentially forming a first organic layer, a first inorganic layer, a second organic layer, and a second inorganic layer on the a-SI sacrificial layer, and irradiating the a-SI sacrificial layer with a laser beam to peel off a stacked layer of the first organic layer, the first inorganic layer, the second organic layer, and the second inorganic layer from the glass substrate. Due to low energy stability of the laser beam, a yield rate is low when the first organic layer is peeled off from the glass substrate with the laser beam.

Therefore, it is necessary to provide a technical solution to improve a yield rate when a flexible substrate is peeled off from a glass substrate.

SUMMARY

A goal of the present disclosure is to provide a flexible display panel and a manufacturing method thereof to improve a yield rate when a flexible substrate of flexible display panels is peeled off.

To achieve the above goal, technical solutions are provided below:

A method of manufacturing a flexible display panel, comprising following steps:
forming a photodeformable layer on a carrier board;
forming a flexible substrate on a side of the photodeformable layer away from the carrier board;
forming a light-emitting device layer on a side of the flexible substrate away from the photodeformable layer; and
irradiating the photodeformable layer with light having a predetermined wavelength until the photodeformable layer is deformed and is separated from the carrier board, thereby obtaining the flexible display panel.

In the method of manufacturing the flexible display panel, after the photodeformable layer disposed on the carrier board is deformed and before the flexible substrate is formed on the side of the photodeformable layer away from the carrier board, the method comprises a following step:
pretreating the photodeformable layer with light having a predetermined wavelength until the photodeformable layer is attached to the carrier board, thereby obtaining a pretreated photodeformable layer.

In the method of manufacturing the flexible display panel, adhesion between the pretreated photodeformable layer and the carrier board is greater than or equal to 0.01 N/cm and is less than or equal to 0.5 N/cm.

In the method of manufacturing the flexible display panel, the predetermined wavelength is greater than or equal to 300 nm and is less than or equal to 400 nm.

In the method of manufacturing the flexible display panel, the photodeformable layer comprises a light-curing material and/or a light-foaming material.

In the method of manufacturing the flexible display panel, the step of forming the flexible substrate on the side of the photodeformable layer away from the carrier board comprises following steps:
forming a first inorganic layer on the photodeformable layer;
forming an organic layer on the first inorganic layer; and
forming a second inorganic layer on the organic layer.

In the method of manufacturing the flexible display panel, the step of irradiating the photodeformable layer with light having the predetermined wavelength until the photodeformable layer is deformed and is separated from the carrier board comprises a following step:
irradiating the photodeformable layer with the light having the predetermined wavelength from the side of the photodeformable layer away from the carrier board.

A flexible display panel, comprising:
a separated layer, wherein the separated layer is formed from a photodeformable layer being deformed due to light irradiation with a predetermined wavelength;
a flexible substrate disposed on the separated layer; and
a light-emitting device layer disposed on a side of the flexible substrate away from the separated layer.

In the flexible display panel, the flexible display panel comprises: a supporting layer disposed on a side of the separated layer away from the flexible substrate.

In the flexible display panel, the flexible display panel comprises:
a first inorganic layer disposed on the separated layer;
an organic layer disposed on a side of the first inorganic layer away from the separated layer; and
a second inorganic layer disposed on a side of the organic layer away from the first inorganic layer.

In the flexible display panel, the flexible display panel comprises:
a thin-film transistor (TFT) array layer, wherein the TFT array layer comprises a plurality of TFTs and is disposed between the flexible substrate and the light-emitting device layer.

Regarding the beneficial effects: embodiments of the present disclosure provide a flexible display panel and a manufacturing method thereof. By irradiating a photodeformable layer with light having a predetermined wavelength until the photodeformable layer is deformed and is separated from a carrier board to form the flexible display panel, a yield rate when a flexible substrate is peeled off from the carrier board of the flexible display panel is improved.

DETAILED DESCRIPTION

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

Figure 1:
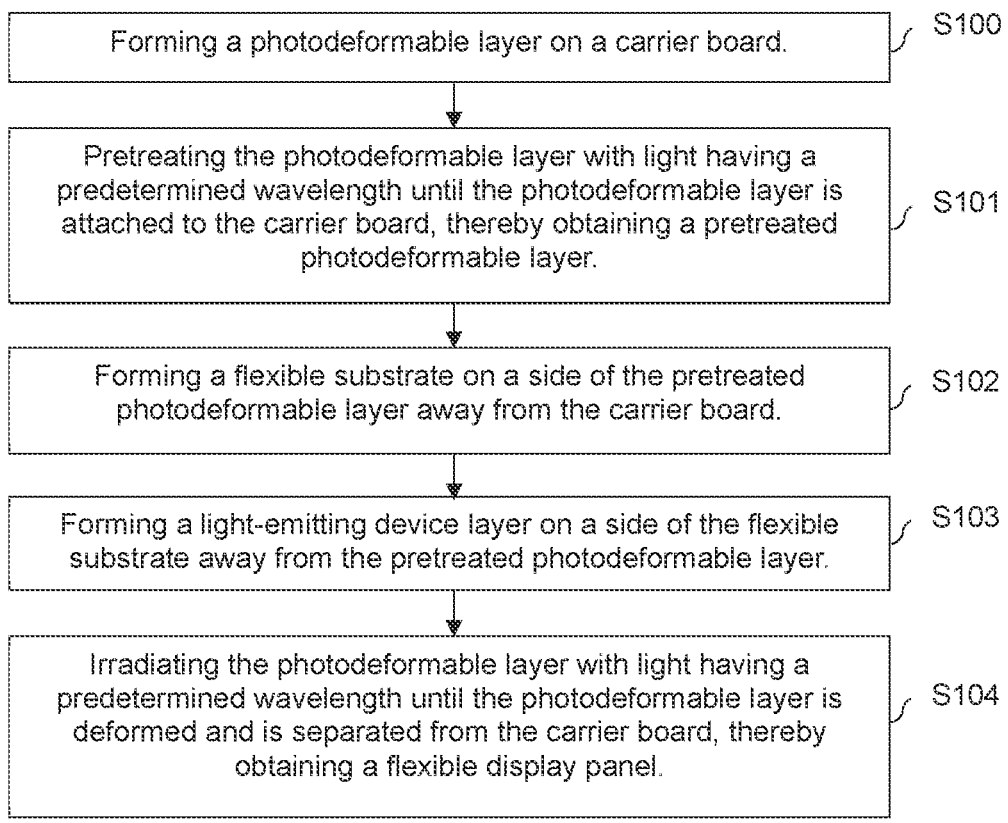
FIG. 1 is a schematic flowchart showing a method of manufacturing a flexible display panel provided by an embodiment of the present disclosure.

As shown in FIG. 1, a schematic flowchart showing a manufacturing method of a flexible display panel provided by an embodiment of the present disclosure is provided. The method of manufacturing of the flexible display panel of the present disclosure includes following steps:

Step S100, forming a photodeformable layer on a carrier board.

Specifically, providing a carrier board 10, and coating a photodeformable layer 201 on the carrier board 10. As shown in FIG. 2, the carrier board 10 is a glass substrate. A thickness of the photodeformable layer ranges from 0.5 μm to 1 μm. For example, the thickness of the photodeformable layer may be 0.8 μm or 1 μm. The photodeformable layer includes a light-curing material. The light-curing material includes a mixture including an epoxy resin and an ultraviolet (UV) curing initiator. It should be understood that the photodeformable layer 201 may also include a light-foaming material. The light-foaming material includes a light-foaming polymer and a light-foaming agent. The light-foaming polymer and the light-foaming agent may be conventional materials. The photodeformable layer 201 may also include the light-foaming agent and the light-curing material.

Step S101, pretreating the photodeformable layer with light having a predetermined wavelength until the photodeformable layer is attached to the carrier board, thereby obtaining a pretreated photodeformable layer.

In the present embodiment, after a layer of the photodeformable layer 201 is coated on the carrier board 10, the photodeformable layer 201 is pretreated by being irradiated with light having a predetermined wavelength L, thereby attaching the photodeformable layer 201 to the carrier board 10. As such, a pretreated photodeformable layer 202 is formed.

The light having the predetermined wavelength is UV light having a wavelength greater than or equal to 300 nm and less than or equal to 400 nm. For example, the wavelength of UV light is 320 nm, 350 nm, 380 nm, or 400 nm. Adhesion between the pretreated photodeformable layer 202 and the carrier board 10 is greater than or equal to 0.01 N/cm and is less than or equal to 0.5 N/cm. Therefore, the adhesion between the pretreated photodeformable layer 202 and the carrier board 10 can be enough great. As such, when a flexible substrate and a light-emitting device are formed in subsequent processes, the pretreated photodeformable layer 202 will not be moved relative to the carrier board 10. Furthermore, the adhesion between the pretreated photodeformable layer 202 and the carrier board is prevented from being overly great, thereby preventing costing too much energy to deform and peel off the pretreated photodeformable layer 202. For example, the adhesion between the photodeformable layer 202 and the carrier board 10 can be 0.01 N/cm, 0.03 N/cm, 0.05 N/cm, 0.1 N/cm, 0.15 N/cm, 0.2 N/cm, 0.3 N/cm, or 0.5 N/cm.

Figure 2A:
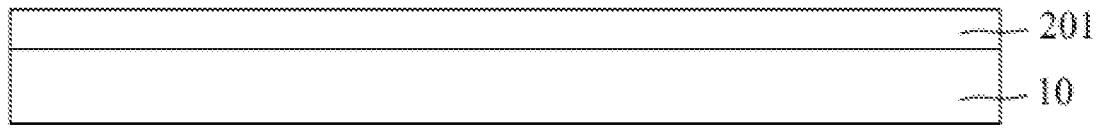
FIGS. 2A to 2F are schematic views showing processes of manufacturing the flexible display panel provided by the embodiment of the present disclosure.
Figure 2B:
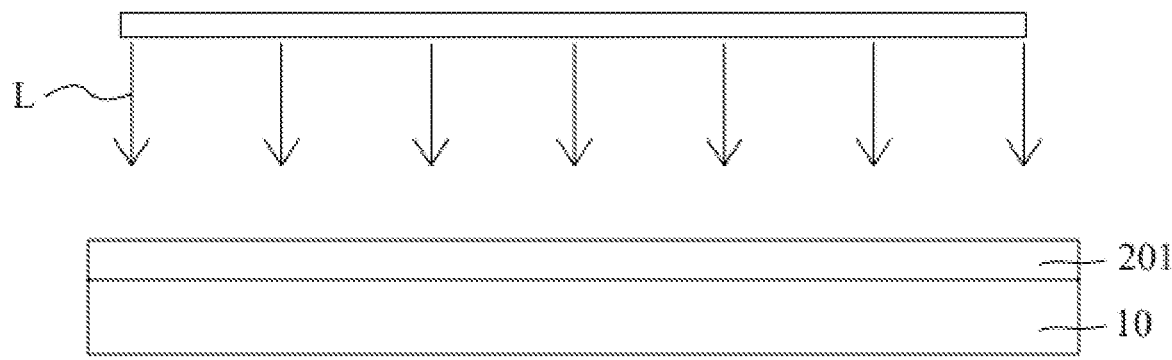

Specifically, as shown in FIG. 2B, a side of the photodeformable layer 201 away from the carrier board 10 is irradiated with UV light having a wavelength greater than or equal to 300 nm and less than or equal to 400 nm. The UV curing initiator in the photodeformable layer 201 is activated, causing the epoxy resin to be precured. The obtained pretreated photodeformable layer 202 has viscosity and a certain hardness. The viscosity of the pretreated photodeformable layer 202 makes the pretreated photodeformable layer 202 be stably attached to the carrier board 10.

Step S102, forming a flexible substrate on a side of the pretreated photodeformable layer away from the carrier board.

Figure 2C:
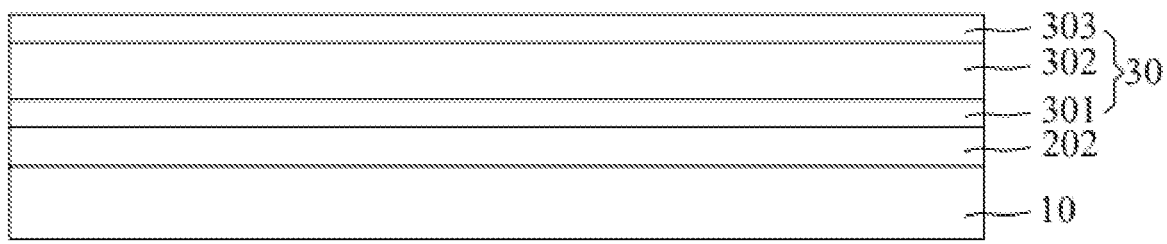

First, as shown in FIG. 2C, a first inorganic layer 301 is formed on the pretreated photodeformable layer 202. Specifically, the first inorganic layer 301 is formed on the pretreated photodeformable layer 202 by any one of chemical deposition, atomic layer deposition, or plasma enhanced chemical vapor deposition. The first inorganic layer 301 has improved moisture and oxygen blocking performance. The first inorganic layer 301 is an inorganic layer. A thickness of the first inorganic layer 301 ranges from 5 nm to 50 nm. A manufacturing material of the first inorganic layer 301 is selected from at least one of $SiO_x$, $SiN_x$, or $Al_2O_3$.

Then, an organic layer 302 is formed on the first inorganic layer 301. Specifically, the organic layer 302 is coated on an entire surface of the first inorganic layer 301. A thickness of the organic layer 302 ranges from 5 μm to 20 μm. A manufacturing method of the organic layer 302 is polyimide.

Finally, a second inorganic layer 303 is formed on the organic layer 302. Specifically, the second inorganic layer 303 is formed on a surface of the organic layer 302 away from the first inorganic layer 301 by any one of chemical deposition, atomic layer deposition, or plasma enhanced chemical vapor deposition. The second inorganic layer 303 has improved moisture and oxygen blocking performance. A thickness of the second inorganic layer 303 ranges from 5 nm to 50 nm. A manufacturing material of the second inorganic layer 303 is selected from at least one of $SiO_x$, $SiN_x$, or $Al_2O_3$.

In the present step, the first inorganic layer 301, the organic layer 302, and the second inorganic layer 303 are sequentially manufactured to form a flexible substrate 30. Compared with conventional flexible substrates having two inorganic layers and two organic layers, the flexible substrate 30 provided by the present embodiment has not only a significantly reduced thickness but also improved moisture and oxygen blocking performance.

Step S103, forming a light-emitting device layer on a side of the flexible substrate away from the pretreated photodeformable layer.

Figure 2D:
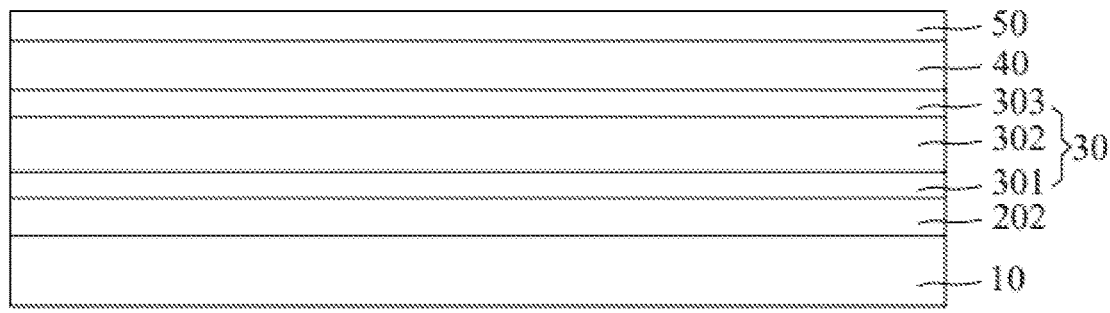

Specifically, as shown in FIG. 2D, a thin-film transistor (TFT) array layer 40 is formed on a side of the second inorganic layer 303 away from the organic layer 302, and a light-emitting device layer 50 is formed on a side of the TFT array layer 40 away from the flexible substrate 30. The TFT array layer 40 includes a plurality of TFTs arranged in an array manner. The TFTs are selected from any one of low-temperature polysilicon TFTs, metal oxide TFTs, or amorphous silicon TFTs. The light-emitting device layer 50 includes a plurality of light-emitting devices. The light-emitting devices are light-emitting diodes.

Step S104, irradiating the photodeformable layer with light having a predetermined wavelength until the photodeformable layer is deformed and is separated from the carrier board, thereby obtaining the flexible display panel.

Figure 2E:
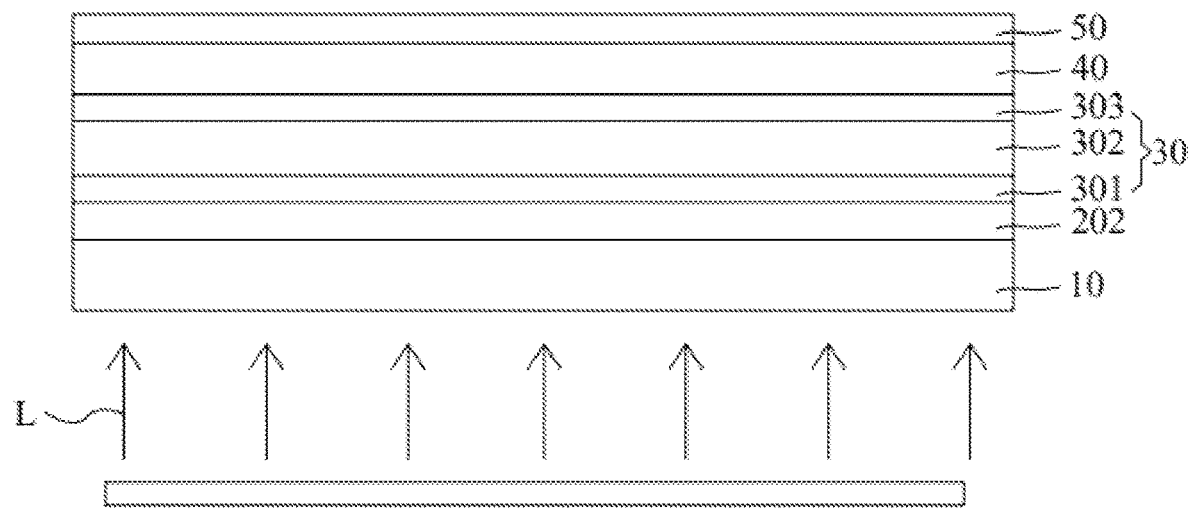
Figure 2F:
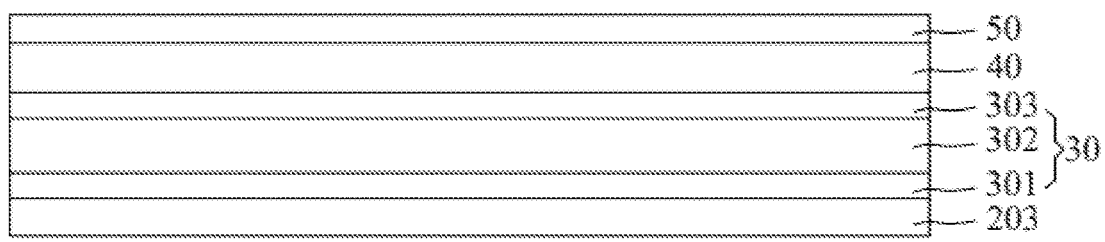

Specifically, as shown in FIGS. 2E to 2F, a side of the carrier board 10 away from the pretreated photodeformable layer 202 is irradiated with light, having a wavelength greater than or equal to 300 nm and less than or equal to 400 nm, emitted from a surface light source until the pretreated photodeformable layer 202 is deformed and is separated from the carrier board 10, thereby obtaining the flexible display panel. Meanwhile, the pretreated photodeformable layer 202 is further cured. Therefore, the photodeformable layer 202 is shrunk to form a separated layer 203.

The side of the carrier board 10 away from the pretreated photodeformable layer 202 is irradiated with light, having the wavelength greater than or equal to 300 nm and less than or equal to 400 nm, emitted from the surface light source, thereby directly exposing the pretreated photodeformable layer 202 to a UV light environment. Therefore, the photodeformable layer 202 can be fast shrunk to be separated from the carrier board 10. In addition, performance of devices is prevented from being affected due to UV light irradiating on the light-emitting device layer.

It should be noted that, when the pretreated photodeformable layer 202 is separated from the carrier board 10 after being cured to be shrunk, the separated layer 203 is completely cured. A curing degree of the separated layer 203 is greater than a curing degree of the pretreated photodeformable layer 202. Furthermore, the separated layer 203 has no viscosity. UV light energy required by deforming the pretreated photodeformable layer 202 to separate the pretreated photodeformable layer 202 from the carrier board 10 is greater than UV light energy required by pretreating the photodeformable layer 201 to obtain the pretreated photodeformable layer 202 having viscosity. An amount of UV light energy can be adjusted by controlling an irradiation period of UV light or by controlling a wavelength of UV light.

In conventional technologies, a peeling off process is performed with a laser beam that is a point light source. Therefore, energy is difficult to be controlled, causing nonuniformity of energy. Consequently, part of a flexible substrate cannot be peeled off from a glass substrate. In the present step, the photodeformable layer 201 is irradiated with UV light emitted from the surface light source. Therefore, the light photodeformable layer 201 is deformed to be peeled off from the carrier board 10. As such, an entire surface can be irradiated with UV light, and an issue of part of a flexible substrate cannot be peeled off from a glass substrate due to nonuniformity of light is prevented, thereby improving a yield rate when the flexible substrate is peeled off. In addition, UV light has a strong penetration power to penetrate particles. By irradiating particles with UV light at different angles, an issue of a position where the particles are located cannot be peeled off due to weak irradiation is solved. Furthermore, energy required by irradiating the photodeformable layer 201 with UV light until the photodeformable layer 201 is deformed and is peeled off is greater than energy required by performing a peeling off process by laser irradiation.

In the method of manufacturing the flexible display panel provided by the present embodiment, a photodeformable layer is irradiated with light having a predetermined wavelength until the photodeformable layer is deformed and is peeled off from a carrier board, thereby obtaining the flexible display panel. As such, a yield rate when a flexible substrate is peeled off from a carrier board of flexible substrates is improved.

Figure 3:
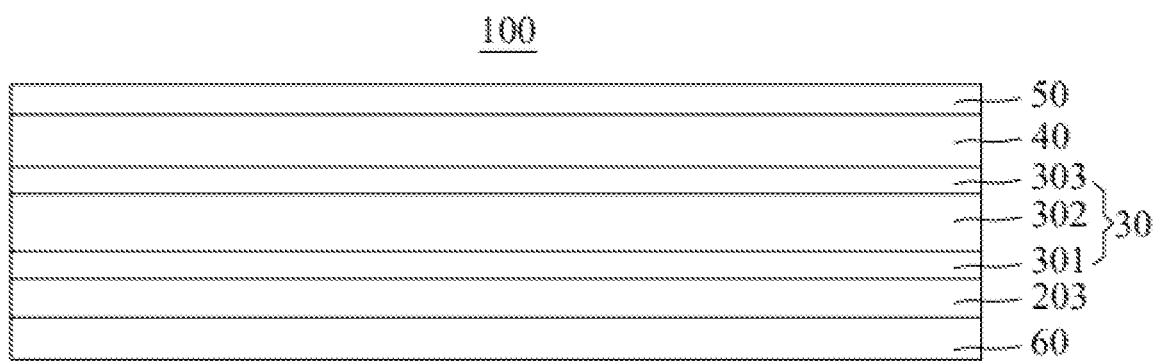
FIG. 3 is a schematic view showing a flexible display panel provided by an embodiment of the present disclosure.

As shown in FIG. 3, the present disclosure further provides a flexible display panel 100. The flexible display panel 100 includes a separated layer 203, a flexible substrate 30, a TFT array layer 40, and a light-emitting device layer 50, which are sequentially stacked. The separated layer 203 is formed from a photodeformable layer being deformed after being irradiated with light having a predetermined wavelength. Light having the predetermined wavelength is UV light having a wavelength greater than or equal to 300 nm and less than or equal to 400 nm.

Specifically, the separated layer 203 is formed from the photodeformable layer, including a light-curing material, being shrunk due to UV light irradiation. The light-curing material includes a mixture including an epoxy resin and a UV curing initiator.

In the present embodiment, the flexible display panel 100 further includes a supporting layer 60 disposed on a side of the separated layer 203 away from the flexible substrate 30, thereby protecting and supporting the flexible substrate 30. The supporting layer 60 is a polydimethyl terephthalate thin film.

In the present embodiment, the flexible substrate 30 includes a first inorganic layer 301, an organic layer 302, and a second inorganic layer 303. The first inorganic layer 301 is disposed on the separated layer 203. The organic layer 302 is disposed on a side of the first inorganic layer 301 away from the separated layer 203. The second inorganic layer 303 is disposed on a side of the organic layer 302 away from the first inorganic layer 301. A thickness of the first inorganic layer 301 ranges from 5 nm to 50 nm. A manufacturing material of the first inorganic layer 301 is selected from at least one of $SiO_x$, $SiN_x$, or $Al_2O_3$. A thickness of the organic layer 302 ranges from 5 μm to 20 μm. A manufacturing material of the organic layer 302 is polyimide. A thickness of the second inorganic layer 303 ranges from 5 nm to 50 nm. A manufacturing material of the second inorganic layer 303 is selected from at least one of $SiO_x$, $SiN_x$, or $Al_2O_3$.

In the present embodiment, the flexible substrate of the flexible display panel is composed of two inorganic layers and one organic layer. Compared with conventional flexible substrates, the flexible substrate provided by the present embodiment has a reduced thickness, which is beneficial for reducing a thickness of the flexible display panel.

The description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A method of manufacturing a flexible display panel, comprising following steps:
    forming a photodeformable layer on a carrier board;
    pretreating the photodeformable layer with light having a predetermined wavelength until the photodeformable layer is attached to the carrier board, thereby obtaining a pretreated photodeformable layer;
    forming a flexible substrate on a side of the pretreated photodeformable layer away from the carrier board;
    forming a light-emitting device layer on a side of the flexible substrate away from the pretreated photodeformable layer; and
    irradiating the pretreated photodeformable layer with light having a predetermined wavelength until the pretreated photodeformable layer is deformed and is separated from the carrier board, thereby obtaining the flexible display panel.

2. The method of claim 1, wherein adhesion between the pretreated photodeformable layer and the carrier board is greater than or equal to 0.01 N/cm and is less than or equal to 0.5 N/cm.

3. The method of claim 1, wherein the predetermined wavelength is greater than or equal to 300 nm and is less than or equal to 400 nm.

4. The method of claim 1, wherein the photodeformable layer comprises a light-curing material or a light-foaming material.

5. The method of claim 1, wherein the step of forming the flexible substrate on the side of the pretreated photodeformable layer away from the carrier board comprises following steps:
forming a first inorganic layer on the pretreated photodeformable layer;
forming an organic layer on the first inorganic layer; and
forming a second inorganic layer on the organic layer.

6. The method of claim 1, wherein the step of irradiating the pretreated photodeformable layer with light having the predetermined wavelength until the pretreated photodeformable layer is deformed and is separated from the carrier board comprises a following step:
irradiating the pretreated photodeformable layer with light having the predetermined wavelength from the side of the pretreated photodeformable layer away from the carrier board.

7. The method of claim 1, wherein a thickness of the photodeformable layer ranges from 0.5 μm to 1 μm.

8. A flexible display panel, comprising:
a supporting layer,
a release layer disposed on the supporting layer, wherein the release layer is a layer formed from a photodeformable layer being cured by UV light irradiation with a predetermined wavelength, the photodeformable layer comprises a light-curing material or a light-foaming material, the light-curing material comprises a mixture of an epoxy resin and a UV curing initiator, and the light-foaming material comprises a light-foaming polymer and a light-foaming agent;
a flexible substrate disposed on a side of the release layer away from the supporting layer; and
a light-emitting device layer disposed on a side of the flexible substrate away from the release layer.

9. The flexible display panel of claim 8, wherein the flexible display panel comprises:
a first inorganic layer disposed on the side of the release layer away from the supporting layer;
an organic layer disposed on a side of the first inorganic layer away from the release layer; and
a second inorganic layer disposed on a side of the organic layer away from the first inorganic layer.

10. The flexible display panel of claim 9, wherein a thickness of the first inorganic layer ranges from 5 nm to 50 nm.

11. The flexible display panel of claim 9, wherein a material of the first inorganic layer comprises $SiO_x$, $SiN_x$, $Al_2O_3$, or a combination thereof.

12. The flexible display panel of claim 9, wherein a thickness of the organic layer ranges from 5 μm to 20 μm.

13. The flexible display panel of claim 9, wherein a material of the organic layer comprises polyimide.

14. The flexible display panel of claim 9, wherein a thickness of the second inorganic layer ranges from 5 nm to 50 nm.

15. The flexible display panel of claim 9, wherein a material of the second inorganic layer comprises $SiO_x$, $SiN_x$, $Al_2O_3$, or a combination thereof.

16. The flexible display panel of claim 8, wherein the flexible display panel comprises:
a thin-film transistor (TFT) array layer, wherein the TFT array layer comprises a plurality of TFTs and is disposed between the flexible substrate and the light-emitting device layer.

17. The flexible display panel of claim 8, wherein the predetermined wavelength is greater than or equal to 300 nm and is less than or equal to 400 nm.

18. A method of manufacturing a flexible display panel, comprising following steps:
forming a photodeformable layer on a carrier board;
forming a flexible substrate on a side of the photodeformable layer away from the carrier board;
forming a light-emitting device layer on a side of the flexible substrate away from the photodeformable layer; and
irradiating the photodeformable layer with light having a predetermined wavelength until the photodeformable layer is deformed and is separated from the carrier board, thereby obtaining the flexible display panel,
wherein the step of irradiating the pretreated photodeformable layer with light having the predetermined wavelength until the pretreated photodeformable layer is deformed and is separated from the carrier board comprises a following step:
irradiating the pretreated photodeformable layer with light having the predetermined wavelength from the side of the pretreated photodeformable layer away from the carrier board.

\* \* \* \* \*